(12) United States Patent
Dussinger et al.

(10) Patent No.: US 7,028,760 B2
(45) Date of Patent: *Apr. 18, 2006

(54) INTEGRATED CIRCUIT HEAT PIPE HEAT SPREADER WITH THROUGH MOUNTING HOLES

(75) Inventors: Peter M. Dussinger, Lititz, PA (US); Thomas L. Myers, Lititz, PA (US); John H. Rosenfeld, Lancaster, PA (US); Kenneth L. Minnerly, Lititz, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/069,260

(22) Filed: Mar. 1, 2005

(65) Prior Publication Data

US 2005/0145374 A1 Jul. 7, 2005

Related U.S. Application Data (63) Continuation of application No. 10/841,784, filed on May 7, 2004, now Pat. No. 6,896,039, which is a continuation-in-part of application No. 09/852,322, filed on May 9, 2001, which is a continuation of application No. 09/310,397, filed on May 12, 1999, now Pat. No. 6,302,192.

(51) Int. Cl.
*F28D 15/00* (2006.01)
*F28F 7/00* (2006.01)
(52) U.S. Cl. .......................... 165/104.26; 165/104.21; 165/104.33; 165/80.3
(58) Field of Classification Search .......... 165/104.21, 165/104.26, 104.33, 80.3, 46, 185, 76, 907; 361/700; 257/715; 419/1–2; 174/15.2; 29/890.032, 890.039
See application file for complete search history.

(56) References Cited

U.S. PATENT DOCUMENTS

| 3,209,062 | A | 9/1965 | Scholz |
| 3,490,718 | A | 1/1970 | Vary |
| 3,519,067 | A | 7/1970 | Schmidt |
| 3,543,841 | A | 12/1970 | Eastman |
| 3,680,189 | A | 8/1972 | Noren |

(Continued)

FOREIGN PATENT DOCUMENTS

DE        1 284 506        12/1968

(Continued)

OTHER PUBLICATIONS

IBM Technical Disclosure Bulletin; *Conduction Cooled Heat Plate For Modular Circuit Package*; Dombrowskas and Patch; vol. 13, No. 2, pp. 442, Jul. 1970.

(Continued)

Primary Examiner—Tho Duong
(74) Attorney, Agent, or Firm—Duane Morris LLP (57) ABSTRACT

A heat pipe with superior heat transfer between the heat pipe and the heat source and heat sink is provided. The heat pipe is held tightly against the heat source by mounting holes which penetrate the structure of the heat pipe but are sealed off from the vapor chamber because they each are located within a sealed structure such as a pillar or the solid layers of the casing surrounding the vapor chamber. Another feature of the heat pipe is the use of a plurality of particles joined together by a brazing compound such that fillets of the brazing compound are formed between adjacent ones of the plurality of particles so as to form a network of capillary passageways between the particles of the wick.

35 Claims, 4 Drawing Sheets

U.S. PATENT DOCUMENTS

| | | | |
|---|---|---|---|
| 3,821,018 A * | 6/1974 | Grant | 427/377 |
| 3,827,480 A | 8/1974 | Gammel et al. | |
| 3,834,457 A | 9/1974 | Madsen | |
| 3,840,069 A * | 10/1974 | Fischer et al. | 165/104.26 |
| 4,046,190 A | 9/1977 | Marcus et al. | |
| 4,047,198 A | 9/1977 | Sekhon et al. | |
| 4,101,691 A * | 7/1978 | Borchert | 427/229 |
| 4,118,756 A | 10/1978 | Nelson et al. | |
| 4,145,708 A | 3/1979 | Ferro et al. | |
| 4,461,343 A * | 7/1984 | Token et al. | 165/104.26 |
| 5,000,256 A | 3/1991 | Tousignant | |
| 5,052,472 A | 10/1991 | Takahashi et al. | |
| 5,305,184 A | 4/1994 | Andresen et al. | |
| 5,305,185 A | 4/1994 | Samarov et al. | |
| 5,323,292 A | 6/1994 | Brzezinski | |
| 5,386,143 A | 1/1995 | Fitch | |
| 5,390,077 A | 2/1995 | Paterson | |
| 5,427,174 A | 6/1995 | Lomolino, Sr. et al. | |
| 5,465,782 A | 11/1995 | Sun et al. | |
| 5,513,070 A | 4/1996 | Xie et al. | |
| 5,642,776 A | 7/1997 | Meyer, IV et al. | |
| 5,694,295 A | 12/1997 | Mochizuki et al. | |
| 5,754,401 A | 5/1998 | Saneinejad et al. | |
| 5,757,621 A | 5/1998 | Patel | |
| 5,784,256 A | 7/1998 | Nakamura et al. | |
| 5,880,524 A | 3/1999 | Xie | |
| 6,082,443 A | 7/2000 | Yamamoto et al. | |
| 6,212,074 B1 | 4/2001 | Gonsalves et al. | |
| 6,256,201 B1 | 7/2001 | Ikeda et al. | |
| 6,263,959 B1 | 7/2001 | Ikeda et al. | |
| 6,269,866 B1 | 8/2001 | Yamamoto et al. | |
| 6,302,192 B1 | 10/2001 | Dussinger et al. | |
| 6,317,322 B1 | 11/2001 | Ueki et al. | |
| 6,356,448 B1 | 3/2002 | DiBene, II et al. | |
| 6,535,386 B1 | 3/2003 | Sathe et al. | |
| 6,650,544 B1 | 11/2003 | Lai | |
| 6,896,039 B1 * | 5/2005 | Dussinger et al. | 165/104.26 |

FOREIGN PATENT DOCUMENTS

| | | | |
|---|---|---|---|
| FR | 2 579 371 | | 9/1986 |
| GB | 1 402 509 | | 8/1975 |
| JP | 54-154277 | | 5/1979 |
| JP | 59024538 A | * | 2/1984 |
| SU | 407160 | | 4/1974 |
| SU | 589531 | | 2/1978 |
| SU | 987357 | | 1/1983 |
| SU | 1261029 | | 9/1986 |
| SU | 1476297 | | 4/1989 |

OTHER PUBLICATIONS

IBM Technical Disclosure Bulletin; *Low-Cost Cooling Package*, Nuccio; vol. 18, No. 11, pp. 3761 & 3762, Apr. 1976.

* cited by examiner

INTEGRATED CIRCUIT HEAT PIPE HEAT SPREADER WITH THROUGH MOUNTING HOLES

CROSS-REFERENCE TO RELATED APPLICATIONS

This application is a continuation application of U.S. application Ser. No. 10/841,784, filed on May 7, 2004 now U.S. Pat. No. 6,896,039, which is itself is a Continuation-in-Part application of Ser. No. 09/852,322, filed on May 09, 2001, which is a Continuation of Ser. No. 09/310,397, filed on May 12, 1999, and now issued as U.S. Pat. No. 6,302,192.

BACKGROUND OF THE INVENTION

This invention relates generally to active solid state devices, and more specifically to a heat pipe for cooling an integrated circuit chip, with the heat pipe designed to be held in direct contact with the integrated circuit.

As integrated circuit chips decrease in size and increase in power, the required heat sinks and heat spreaders have grown to be larger than the chips. Heat sinks are most effective when there is a uniform heat flux applied over the entire heat input surface. When a heat sink with a large heat input surface is attached to a heat source of much smaller contact area, there is significant resistance to the flow of heat along the heat input surface of the heat sink to the other portions of the heat sink surface which are not in direct contact with the contact area of the integrated circuit chip. Higher power and smaller heat sources, or heat sources which are off center from the heat sink, increase the resistance to heat flow to the balance of the heat sink. This phenomenon can cause great differences in the effectiveness of heat transfer from various parts of a heat sink. The effect of this unbalanced heat transfer is reduced performance of the integrated circuit chip and decreased reliability due to high operating temperatures.

The brute force approach to overcoming the resistance to heat flow within heat sinks which are larger than the device being cooled is to increase the size of the heat sink, increase the thickness of the heat sink surface which contacts the device to be cooled, increase the air flow which cools the heat sink, or reduce the temperature of the cooling air. However, these approaches increase weight, noise, system complexity, and expense.

It would be a great advantage to have a simple, light weight heat sink for an integrated circuit chip which includes an essentially isothermal surface even though only a part of the surface is in contact with the chip, and also includes a simple means for assuring intimate contact with the integrated circuit chip to provide good heat transfer between the chip and the heat sink.

SUMMARY OF THE INVENTION

The present invention is an inexpensive heat pipe heat spreader for integrated circuit chips which is of simple, light weight construction. It is easily manufactured, requires little additional space, and provides additional surface area for cooling the integrated circuit and for attachment to heat transfer devices for moving the heat away from the integrated circuit chip to a location from which the heat can be more easily disposed of. Furthermore, the heat pipe heat spreader is constructed to assure precise flatness and to maximize heat transfer from the heat source and to the heat sink, and has holes through its body to facilitate mounting.

The heat spreader of the present invention is a heat pipe which requires no significant modification of the circuit board or socket because it is held in intimate contact with the integrated circuit chip by conventional screws attached to the integrated mounting board. This means that the invention uses a very minimum number of simple parts. Furthermore, the same screws which hold the heat spreader against the chip can also be used to clamp a finned heat sink to the opposite surface of the heat spreader.

The internal structure of the heat pipe is an evacuated vapor chamber with a limited amount of liquid and includes a pattern of spacers extending between and contacting the two plates or any other boundary structure forming the vapor chamber. The spacers prevent the plates from bowing inward, and therefore maintain the vital flat surface for contact with the integrated circuit chip. These spacers can be solid columns, embossed depressions formed in one of the plates, or a mixture of the two. Porous capillary wick material also covers the inside surfaces of the heat pipe and has a substantial thickness surrounding the surfaces of the spacers within the heat pipe, thus forming pillars of porous wick surrounding the supporting spacers. The wick therefore spans the space between the plates in multiple locations, and comprises a plurality of particles joined together by a brazing compound such that fillets of the brazing compound are formed between adjacent ones of the plurality of particles so as to form a network of capillary passageways between the particles.

The spacers thus serve important purposes. They support the flat plates and prevent them from deflecting inward and distorting the plates to deform the flat surfaces which are required for good heat transfer. The spacers also serve as critical support for the portions of the capillary wick pillars which span the space between the plates provide a gravity independent characteristic to the heat spreader, and the spacers around which the wick pillars are located assure that the capillary wick is not subjected to destructive compression forces.

The spacers also make it possible to provide holes into and through the vapor chamber, an apparent inconsistency since the heat pipe vacuum chamber is supposed to be vacuum tight. This is accomplished by bonding the spacers, if they are solid, to both plates of the heat pipe, or, if they are embossed in one plate, bonding the portions of the depressions which contact the opposite plate to that opposite plate. With the spacer bonded to one or both plates, a through hole can be formed within the spacer and it has no effect on the vacuum integrity of the heat pipe vapor chamber, from which the hole is completely isolated.

An alternate embodiment of the invention provides the same provision for mounting the heat pipe spreader with simple screws even when the heat pipe is constructed without internal spacers. This embodiment forms the through holes in the solid boundary structure around the outside edges of the two plates. This region of the heat pipe is by its basic function already sealed off from the vapor chamber by the bond between the two plates, and the only additional requirement for forming a through hole within it is that the width of the bonded region be larger than the diameter of the hole. Clearly, with the holes located in the peripheral lips, the heat pipe boundary structure can be any shape.

Another alternative embodiment of the invention provides for improved heat transfer between the integrated circuit chip and the heat pipe heat spreader. This is accomplished by using a different capillary wick material within the heat pipe at the location which is directly in contact with the chip. Instead of using the same sintered copper powder wick which is used throughout the rest of the heat pipe, the part of the wick which is on the region of the heat pipe surface which is in contact with the chip is constructed of higher thermal conductivity sintered powder. Such powder can be silver, diamond, or many other materials well known in the art. This provides for significantly better heat transfer in the most critical heat transfer area, right at the integrated circuit chip.

The present invention thereby provides a heat pipe superior heat transfer characteristics, and the simplest of all mounting devices, just several standard screws.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENTS

Heat pipe 10 is constructed by forming a boundary structure by sealing together two formed plates, contact plate 18 and cover plate 20. Contact plate 18 and cover plate 20 are sealed together at their peripheral lips 22 and 24 by conventional means, such as soldering or brazing, to form heat pipe 10. Heat pipe 10 is then evacuated to remove all non-condensible gases and a suitable quantity of heat transfer fluid is placed within it. This is the conventional method of constructing a heat pipe, and is well understood in the art of heat pipes.

The interior of heat pipe 10 is, however, constructed unconventionally. While contact plate 18 is essentially flat with the exception of peripheral lip 24, cover plate 20 includes multiple depressions 26. Depressions 26 are formed and dimensioned so that, when contact plate 18 and cover plate 20 are joined, the flat portions of depressions 26 are in contact with inner surface 28 of contact plate 18. Depressions 26 thereby assure that the spacing between contact plate 18 and cover plate 20 will be maintained even though pressure differentials between the inside volume of heat pipe 10 and the surrounding environment might otherwise cause the plates to deflect toward each other.

Heat pipe 10 also includes internal sintered metal capillary wick 30 which covers the entire inside surface of contact plate 18. As is well understood in the art of heat pipes, a capillary wick provides the mechanism by which liquid condensed at the cooler condenser of a heat pipe is transported back to the hotter evaporator where it is evaporated. The vapor produced at the evaporator then moves to the condenser where it again condenses. The two changes of state, evaporation at the hotter locale and condensation at the cooler site, are what transport heat from the evaporator to the condenser.

In the present invention, heat pipe 10 also has capillary wick pillars 32 which bridge the space between contact plate 18 and cover plate 20. Pillars 32 thereby interconnect cover plate 16 and contact plate 14 with continuous capillary wick. This geometry assures that, even if heat pipe 10 is oriented so that cover plate 16 is lower than contact plate 14, liquid condensed upon inner surface 34 of cover plate 20 will still be in contact with capillary pillars 32. The liquid will therefore be moved back to raised surface 28 which functions as the evaporator because it is in contact with a heat generating integrated circuit (not shown). Capillary pillars 32 are wrapped around and supported by depressions 26, which prevents the structurally weaker capillary pillars 32 from suffering any damage.

Figure 1:
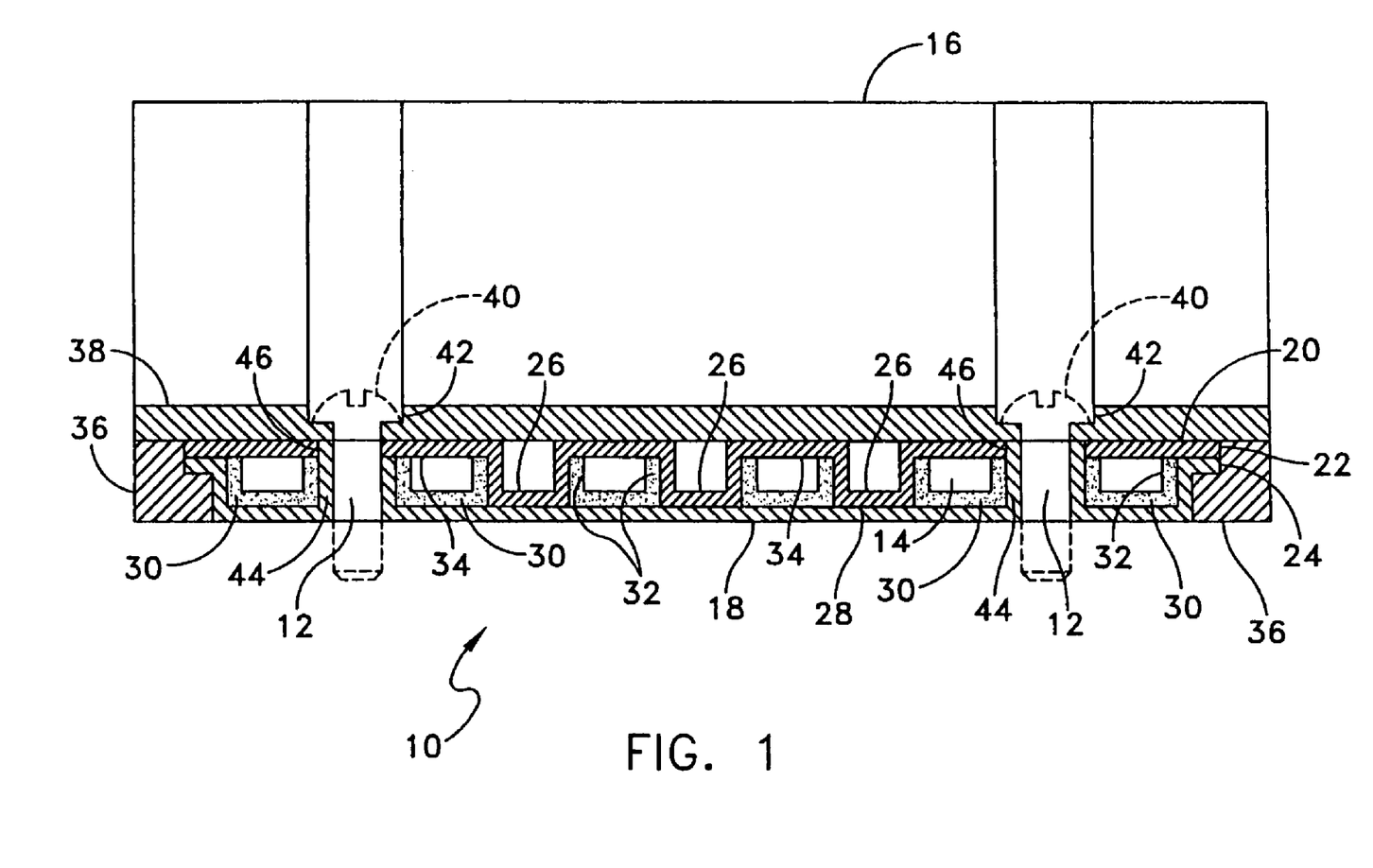
FIG. 1 is a cross-sectional view of one embodiment of a flat plate heat pipe with through holes through its vapor chamber and in contact with a finned heat sink.

FIG. 1 also shows frame 36 which is typically used to surround and protect heat pipe 10. Frame 34 completely surrounds heat pipe 10 and contacts lip 24 of contact plate 18. When heat pipe 10 is used to cool an integrated circuit chip (not shown) which is held against contact plate 18, cover plate 20 is held in intimate contact with fin plate 38, to which fins 16 are connected. The entire assembly of heat pipe 10, frame 34, and fin plate 38 is held together and contact plate 18 is held against an integrated circuit chip by conventional screws 40, shown in dashed lines, which are placed in holes 42 in fin plate 38 and through holes 12 in heat pipe 10, and are threaded into the mounting plate (not shown) for the integrated circuit chip.

Holes 12 penetrate heat pipe 10 without destroying its vacuum integrity because of their unique location. Holes 12 are located within sealed structures such as solid columns 44, and since columns 44 are bonded to cover plate 20 at locations 46, holes 12 passing through the interior of columns 44 have no affect on the interior of heat pipe 10.

The preferred embodiment of the invention has been constructed as heat pipe 10 as shown in FIG. 1. This heat pipe is approximately 3.0 inches by 3.5 inches with a total thickness of 0.200 inch. Cover plate 20 and contact plate 18 are constructed of OFHC copper 0.035 inch thick, and depressions 26 span the 0.100 inch height of the internal volume of heat pipe 10. The flat portions of depressions 26 are 0.060 inch in diameter. Capillary wick 30 is constructed of sintered copper powder and averages 0.040 inch thick. Columns 44 have a 0.250 inch outer diameter, and holes 12 are 0.210 in diameter.

Figures 2, 4:
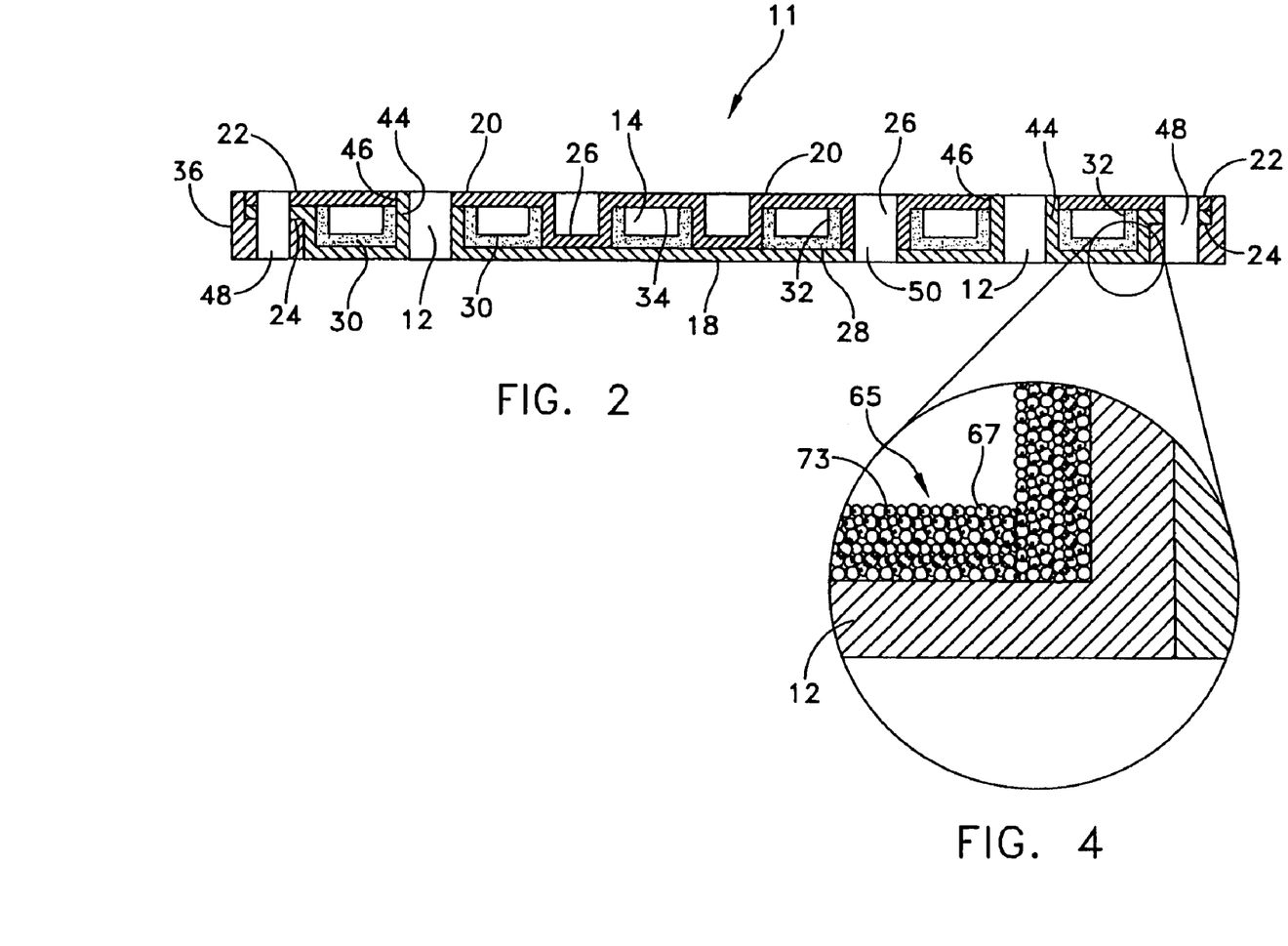
FIG. 2 is a cross-sectional view of the flat plate heat pipe shown in FIG. 1, with the finned heat sink removed for clarity of illustration.
FIG. 4 is an exploded and enlarged view of a portion of the wick structure formed in accordance with the present invention.

FIG. 2 is a cross section view of an alternate embodiment of the flat plate heat pipe 11 of the invention with through holes 48 located within peripheral lips 22 and 24 of the heat pipe and hole 50 shown in another sealed structure, one of the depressions 26. The only requirement for forming hole 50 within a depression 26 is that the bottom of depression 26 must be bonded to inner surface 28 of contact plate 18 to prevent loss of vacuum within the heat pipe. Of course, the region of the peripheral edges is also a sealed structure since bonding between lips 22 and 24 is inherent because heat pipe 11 must be sealed at its edges to isolate the interior from the outside atmosphere.

The only differences between heat pipe 11 of FIG. 2 and heat pipe 10 of FIG. 1 are that finned heat sink 16 is not shown in FIG. 2, lips 22 and 24 are slightly longer in FIG. 2 to accommodate holes 48, and hole 50 is shown. In fact, through holes 12 shown in FIG. 12 are also included in FIG. 2. Although it is unlikely that holes 12, holes 48, and hole 50 would be used in the same assembly, manufacturing economies may make it desirable to produce all the holes in every heat pipe so that the same heat pipe heat spreader can be used with different configurations of finned heat sinks. The unused sets of holes have no effect on the operation or benefits of the invention.

Figure 3:
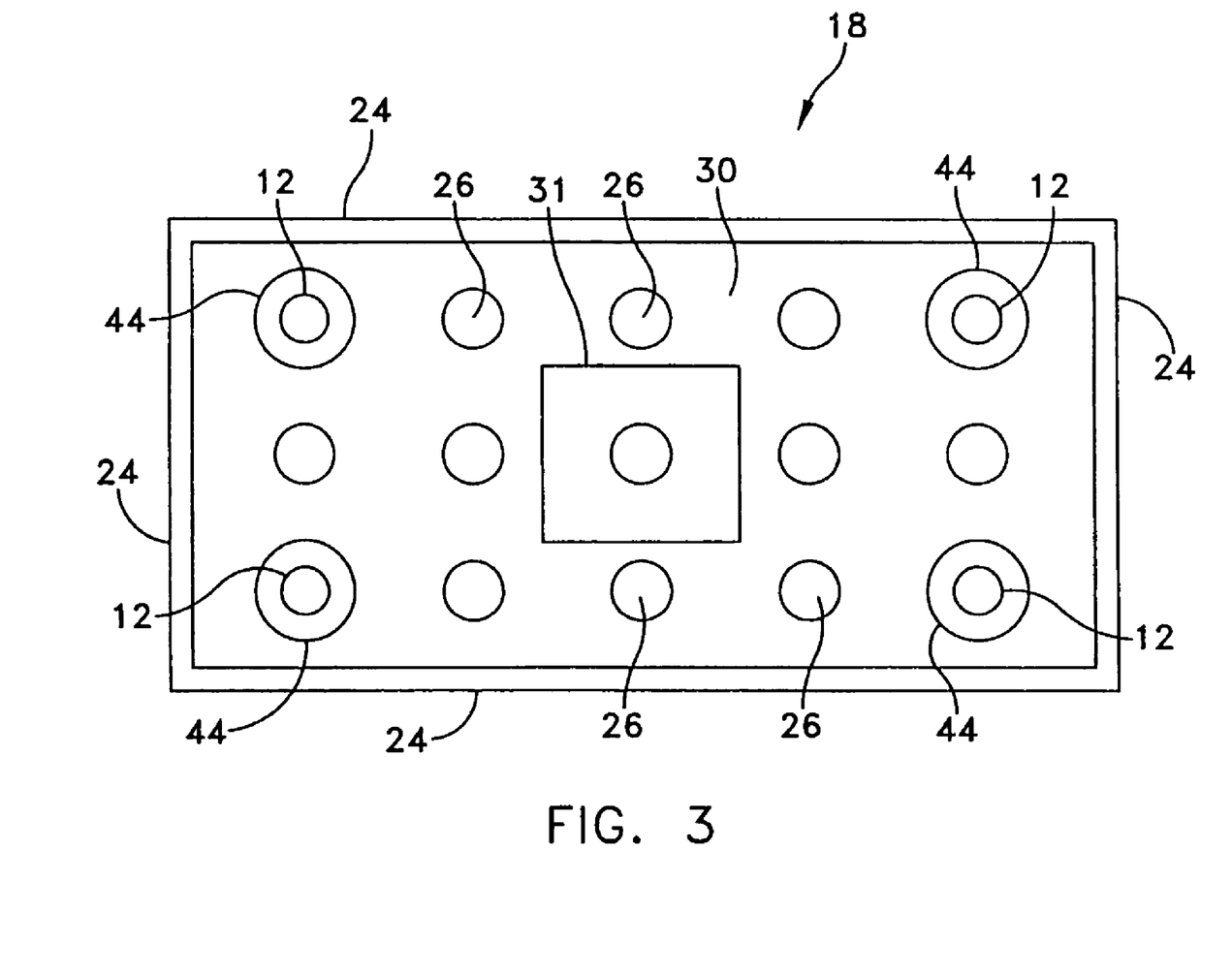
FIG. 3 is a plan view of the flat plate heat pipe shown in FIGS. 1 and 2.

FIG. 3 is a plan view of the internal surface of the contact plate 18 of the heat pipe 10 of the invention showing region 31 of capillary wick 30. Region 31 is constructed of sintered silver powder. While the balance of capillary wick 30 is conventional sintered metal such as copper, region 31 of capillary wick 30, which is on the opposite surface of contact plate 18 from the integrated circuit chip (not shown), is formed of powdered silver. The higher thermal conductivity of silver yields significantly better heat conduction through region 31 of the wick 30, and thereby reduces the temperature difference between the integrated circuit chip and the vapor within heat pipe 10. This reduction of temperature difference directly affects the operation of heat pipe 10, and essentially results in a similar reduction in the operating temperature of the chip.

In one embodiment of the present invention, a brazed wick 65 is located on the inner surface of contact 18. Brazed wick 65 comprises a plurality of metal particles 67 combined with a filler metal or combination of metals that is often referred to as a "braze" or brazing compound 70. It will be understood that "brazing" is the joining of metals through the use of heat and a filler metal, i.e., brazing compound 70. Brazing compound 70 very often comprises a melting temperature that is above 450° C.–1000° C. but below the melting point of metal particles 67 that are being joined to form brazed wick 65.

Figure 5:
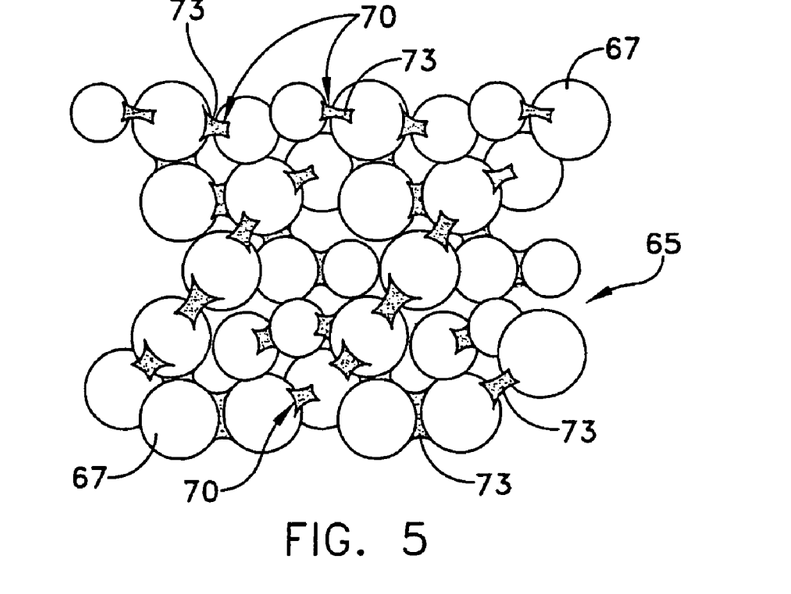
FIG. 5 is a representation of a brazed wick formed in accordance with one embodiment of the present invention.
Figure 6:
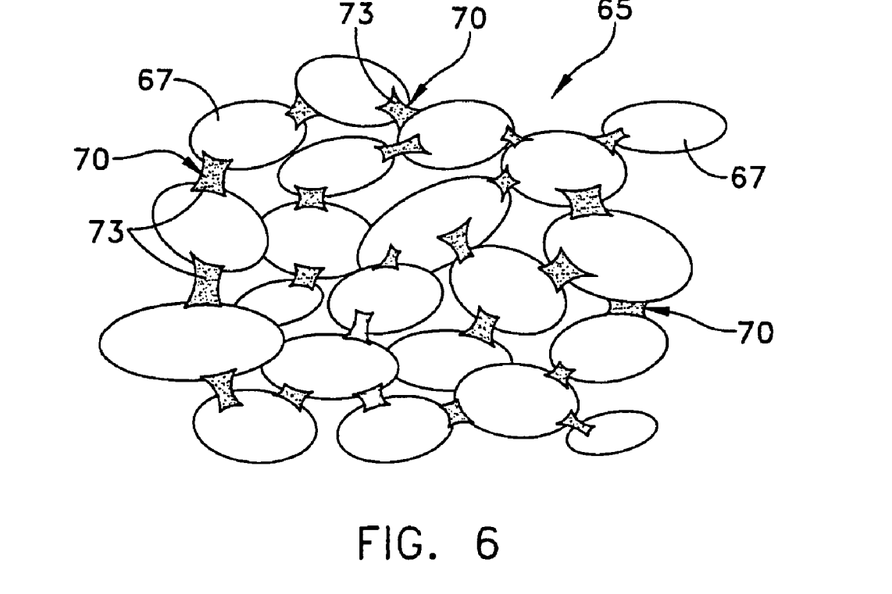
FIG. 6 is a representation of another brazed wick formed in accordance with a further embodiment of the present invention.

In general, to form brazed wick 65 according to the present invention, a plurality of metal particles 67 and brazing compound 70 are heated together to a brazing temperature that melts brazing compound 70, but does not melt plurality of metal particles 67. Significantly, during brazing metal particles 67 are not fused together as with sintering, but instead are joined together by creating a metallurgical bond between brazing compound 70 and the surfaces of adjacent metal particles 67 through the creation of fillets of re-solidified brazing compound (identified by reference numeral 73 in FIGS. 5 and 6). Advantageously, the principle by which brazing compound 70 is drawn through the porous mixture of metal particles 67 to create fillets 73 is "capillary action", i.e., the movement of a liquid within the spaces of a porous material due to the inherent attraction of molecules to each other on a liquid's surface. Thus, as brazing compound 70 liquefies, the molecules of molten brazing metals attract one another as the surface tension between the molten braze and the surfaces of individual metal particles 67 tends to draw the molten braze toward each location where adjacent metal particles 67 are in contact with one another. Fillets 73 are formed at each such location as the molten braze metals re-solidify.

In the present invention, brazing compound 70 and fillets 73 create a higher thermal conductivity wick than, e.g., sintering or fusing techniques. This higher thermal conductivity wick directly improves the thermal conductance of the heat transfer device in which it is formed, e.g., heat pipe, loop heat pipe, etc. Depending upon the regime of heat flux that, e.g., region 31, is subjected to, the conductance of brazed wick 65 has been found to increase between directly proportional to and the square root of the thermal conductivity increase. Importantly, material components of brazing compound 70 must be selected so as not to introduce chemical incompatibility into the materials system comprising flat plate heat pipe 10.

Metal particles 67 may be selected from any of the materials having high thermal conductivity, that are suitable for fabrication into brazed porous structures, e.g., carbon, tungsten, copper, aluminum, magnesium, nickel, gold, silver, aluminum oxide, beryllium oxide, or the like, and may comprise either substantially spherical, oblate or prolate spheroids, ellipsoid, or less preferably, arbitrary or regular polygonal, or filament-shaped particles of varying cross-sectional shape. For example, when metal particles 67 are formed from copper spheres (FIG. 5) or oblate spheroids (FIG. 6) whose melting point is about 1083° C., the overall wick brazing temperature for flat plate heat pipe 10 will be about 1000° C. By varying the percentage brazing compound 70 within the mix of metal particles 67 or, by using a more "sluggish" alloy for brazing compound 70, a wide range of heat-conduction characteristics may be provided between metal particles 67 and fillets 73.

For example, in a copper/water heat pipe, any ratio of copper/gold braze could be used, although brazes with more gold are more expensive. A satisfactory combination for brazing compound 30 has been found to be about six percent (6)% by weight of a finely divided (–325 mesh), 65%/35% copper/gold brazing compound, that has been well mixed with the copper powder (metal particles 67). More or less braze is also possible, although too little braze reduces the thermal conductivity of brazed wick 65, while too much braze will start to fill the wick pores with solidified braze metal. One optimal range has been found to be between about 2% and about 10% braze compound, depending upon the braze recipe used. When employing copper powder as metal particles 67, a preferred shape of particle is spherical or spheroidal. Metal particles 67 should often be coarser than about 200 mesh, but finer than about 20 mesh. Finer wick powder particles often require use of a finer braze powder particle. The braze powder of brazing compound 70 should often be several times smaller in size than metal particles 67 so as to create a uniformly brazed wick 65 with uniform properties.

Other brazes can also be used for brazing copper wicks, including nickel-based Nicrobrazes, silver/copper brazes, tin/silver, lead/tin, and even polymers. The invention is also not limited to copper/water heat pipes. For example, aluminum and magnesium porous brazed wicks can be produced by using a braze that is an aluminum/magnesium intermetallic alloy.

Brazing compound 70 should often be well distributed over each metal particle surface. This distribution of brazing compound 70 may be accomplished by mixing brazing compound 70 with an organic liquid binder, e.g., ethyl cellulose, that creates an adhesive quality on the surface of each metal particle 67 (i.e., the surface of each sphere or spheroid of metal) for brazing compound 70 to adhere to. In one embodiment of the invention, one and two tenths grams by weight of copper powder (metal particles 67) is mixed with two drops from an eye dropper of an organic liquid binder, e.g., ISOBUTYL METHACRYLATE LACQUER to create an adhesive quality on the surface of each metal particle 67 (i.e., the surface of each sphere or spheroid of metal) for braze compound 70 to adhere to. A finely divided (e.g., –325 mesh) of braze compound 70 is mixed into the liquid binder coated copper powder particles 67 and allowed to thoroughly air dry. About 0.072 grams, about 6% by weight of copper/gold in a ratio of 65%/35% copper/gold brazing compound, has been found to provide adequate results. The foregoing mixture of metal particles 67 and brazing compound 70 are applied to the internal surfaces of flat plate heat pipe 10, for example the inner surface contact plate 18 and heated evenly so that brazing compound 70 is melted by heating metal particles 67. Molten brazing compound 70 that is drawn by capillary action, forms fillets 73 as it solidifies within the mixture of metal particles 67. For example, vacuum brazing or hydrogen brazing at about 1020 C for between two to eight minutes, and preferably about five minutes, has been found to provide adequate fillet formation within a brazed wick. A vacuum of at least $10^{-5}$ torr or lower has been found to be sufficient, and if hydrogen furnaces are to be used, the hydrogen furnace should use wet hydrogen. In one embodiment, the assembly is vacuum fired at 1020° C., for 5 minutes, in a vacuum of about $5\times10^{-5}$ torr or lower.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims. For example, through holes could also penetrate heat pipe boundary structures with curved surfaces or heat pipe boundary structures with offset planes which create several different levels for contact with heat sources or heat sinks.

What is claimed is:

1. An assembly for forming a heat pipe for spreading heat comprising:
   a boundary structure including spaced-apart first and second plates that define an enclosed vapor chamber having a plurality of first particles having a first melting temperature and a brazing compound comprising a plurality of second particles having a second melting temperature that is lower than said first melting temperature whereby said plurality of first particles are joined together by said brazing compound by melting said plurality of second particles such that fillets of said brazing compound are formed between adjacent ones of said plurality of first particles so as to form a network of capillary passageways between said first particles;
   at least one depression formed in said first plate which projects into said vapor chamber and is bonded to said second plate; and
   an opening defined through said at least one depression and said second plate wherein said opening is isolated from said vapor chamber.

2. An assembly for forming a heat pipe for spreading heat according to claim 1 comprising at least one spacer positioned within said vapor chamber and extending between and contacting said first and second plates.

3. An assembly for forming a heat pipe for spreading heat according to claim 1 wherein said spaced-apart first and second plates include confronting interior surfaces; and
   a wick positioned upon said confronting interior surfaces including that portion of the interior surface of said first plate that forms a surface of said depression within said vapor chamber.

4. An assembly for forming a heat pipe for spreading heat according to claim 3 wherein said wick is constructed with at least two separate sections of different materials, with one section being located on said first plate interior surface and being formed of a material with higher heat conductivity than sections located on said second plate interior surface.

5. An assembly for forming a heat pipe for spreading heat according to claim 1 wherein said depression comprises an annular outer surface that is bonded to a corresponding annular edge surface in said second plate.

6. An assembly for forming a heat pipe for spreading heat according to claim 1 wherein said first and second plates each include a peripheral lip located at an edge of said boundary structure which are bonded together.

7. An assembly for forming a heat pipe for spreading heat according to claim 1 wherein said brazing compound comprises about sixty-five percent weight copper and thirty-five percent weight gold particles such that said fillets of said brazing compound are formed between adjacent ones of said plurality of particles so as to create a network of capillary passageways between said particles.

8. A heat pipe for spreading heat formed from the assembly of claim 1 wherein said fillets are formed by capillary action of said braze compound when in a molten state.

9. An assembly for forming a heat pipe for spreading heat according to claim 1 wherein said plurality of first particles are selected from the group consisting of carbon, tungsten, copper, aluminum, magnesium, nickel, gold, silver, aluminum oxide, and beryllium oxide.

10. An assembly for forming a heat pipe for spreading heat according to claim 1 wherein a Plurality of said plurality of first particles comprise a shape selected from the group consisting of spherical, oblate spheroid, prolate spheroid, ellipsoid, polygonal, and filament.

11. An assembly for forming a heat pipe for spreading heat according to claim 1 wherein said plurality of first particles comprise at least one of copper spheres and oblate copper spheroids having a melting point of about one thousand eighty-three° C.

12. An assembly for forming a heat pipe for spreading heat according to claim 1 wherein said brazing compound comprises six percent by weight of a finely divided copper/gold second particles.

13. An assembly for forming a heat pipe for spreading heat according to claim 1 wherein said brazing compound is present in the range from about two percent to about ten percent.

14. An assembly for forming a heat pipe for spreading heat according to claim 1 wherein said plurality of first particles comprise copper powder comprising particles sized in a range from about twenty mesh to about two-hundred mesh.

15. An assembly for forming a heat pipe for spreading heat according to claim 1 wherein said braze compound second particles comprise about minus three hundred and twenty-five mesh.

16. An assembly for forming a heat pipe for spreading heat according to claim 1 wherein said second particles that are a constituent portion of said braze compound comprise a smaller size than said plurality of first particles.

17. An assembly for forming a heat pipe for spreading heat according to claim 1 wherein said braze compound is selected from the group consisting of nickel-based Nicrobrazes, silver/copper brazes, tin/silver, lead/tin, and polymers.

18. An assembly for forming a heat pipe for spreading heat according to claim 1 wherein said plurality of first particles comprise aluminum and magnesium and said brazing compound comprises an aluminum/magnesium intermetallic alloy second particles.

19. An assembly for forming a heat pipe for spreading heat comprising:
- a boundary structure including spaced-apart first and second plates that define an enclosed vapor chamber having a plurality of first particles having a first melting temperature and a brazing compound comprising a plurality of second particles having a second melting temperature that is lower than said first melting temperature whereby said plurality of first particles are joined together by said brazing compound by melting said plurality of second particles such that fillets of said brazing compound are formed between adjacent ones of said plurality of first particles so as to form a network of capillary passageways between said first particles;
- at least one depression formed in said first plate which projects into said vapor chamber and is bonded to said second plate;
- an opening defined through said first plate depression and said second plate wherein said opening is isolated from said vapor chamber; and
- at least one depression formed in said second plate which projects into said vapor chamber and is bonded to said first plate.

20. An assembly for forming a heat pipe for spreading heat according to claim 19 wherein said at least one depression formed in said second plate comprises a flat portion that is in contact with an inner surface of said first plate.

21. An assembly for forming a heat pipe for spreading heat according to claim 19 wherein said spaced-apart first and second plates include confronting interior surfaces; and
- a wick positioned upon said confronting interior surfaces including that portion of the interior surface of said first plate that forms a surface of said depression within said vapor chamber.

22. An assembly for forming a heat pipe for spreading heat according to claim 19 wherein said brazing compound comprises about sixty-five percent weight copper and thirty-five percent weight gold particles such that said assembly is heated so as to melt said plurality of second particles, said fillets of said brazing compound are formed between adjacent ones of said plurality of particles so as to create a network of capillary passageways between said particles.

23. A heat pipe for spreading heat formed from the assembly of heat claim 19 wherein said fillets are formed by capillary action of said braze compound when in a molten state.

24. An assembly for forming a heat pipe for spreading heat according to claim 19 wherein said plurality of first particles are selected from the group consisting of carbon, tungsten, copper, aluminum, magnesium, nickel, gold, silver, aluminum oxide, and beryllium oxide.

25. An assembly for forming a heat pipe for spreading heat according to claim 19 wherein said plurality of first particles comprise a shape selected from the group consisting of spherical, oblate spheroid, prolate spheroid, ellipsoid, polygonal, and filament.

26. An assembly for forming a heat pipe for spreading heat according to claim 19 wherein said plurality of first particles comprise at least one of copper spheres and oblate copper spheroids having a melting point of about one thousand eighty-three° C.

27. An assembly for forming a heat pipe for spreading heat according to claim 22 wherein said brazing compound comprises six percent by weight of a finely divided copper/gold second particles.

28. An assembly for forming a heat pipe for spreading heat according to claim 22 wherein said brazing compound is present in the range from about two percent to about ten percent.

29. An assembly for forming a heat pipe for spreading heat according to claim 22 wherein said plurality of first particles comprise copper powder comprising particles size in a range from about twenty mesh to about two-hundred mesh.

30. An assembly for forming a heat pipe for spreading heat according to claim 22 wherein said second particles of said braze compound comprise about minus three hundred and twenty-five mesh.

31. An assembly for forming a heat pipe for spreading heat according to claim 19 wherein said plurality of second particles that are a constituent portion of said braze compound comprise a smaller size than said plurality of first particles.

32. An assembly for forming a heat pipe for spreading heat according to claim 19 wherein plurality of second particles that form said braze compound are selected from the group consisting of nickel-based Nicrobrazes, silver/copper brazes, tin/silver, lead/tin, and polymers.

33. An assembly for forming a heat pipe for spreading heat according to claim 19 wherein said plurality of first particles comprise aluminum and magnesium and said plurality of second particles that form said brazing compound comprise an aluminum/magnesium intermetallic alloy.

34. An assembly for forming a heat pipe for spreading heat comprising:
- a boundary structure including spaced-apart first and second plates that define an enclosed vapor chamber having a plurality of first particles having a first melting temperature and a brazing compound comprising a plurality of second particles having a second melting temperature that is lower than said first melting temperature whereby said plurality of first particles are joined together by said brazing compound by melting said plurality of second particles such that fillets of said brazing compound are formed between adjacent ones of said plurality of first particles so as to form a network of capillary passageways between said first particles;
- at least one hollow column positioned within said vapor chamber and sealingly bonded to said first and second plates, having an open first end that opens through said first plate and an open second end that opens through said second plate so as to form at least one mounting hole that is isolated from said vapor chamber.

35. An assembly for forming a heat pipe for spreading heat according to claim 34 wherein said spaced-apart first and second plates include confronting interior surfaces; and
- wherein a mixture of said plurality of first and second particles is positioned upon said confronting interior surfaces of said first and second plates the exterior surface of said at least one hollow column disposed within said vapor chamber.

* * * * *